(12) United States Patent
Wang et al.

(10) Patent No.: US 10,749,664 B1
(45) Date of Patent: Aug. 18, 2020

(54) CLOCK DATA RECOVERY FOR AUTOMOTIVE VISION SYSTEM

(71) Applicant: Ambarella International LP, Santa Clara, CA (US)

(72) Inventors: Xuan Wang, San Jose, CA (US); Jingxiao Li, San Jose, CA (US); Tianwei Liu, Fremont, CA (US); Yuan-Fu Lin, Santa Clara, CA (US)

(73) Assignee: Ambarella International LP, Santa Clara, CA (US)

( * ) Notice: Subject to any disclaimer, the term of this patent is extended or adjusted under 35 U.S.C. 154(b) by 3 days.

(21) Appl. No.: 16/352,231

(22) Filed: Mar. 13, 2019

(51) Int. Cl.
*H04L 7/04* (2006.01)
*H03M 1/66* (2006.01)
*H03L 7/08* (2006.01)

(52) U.S. Cl.
CPC ............. *H04L 7/04* (2013.01); *H03L 7/0807* (2013.01); *H03M 1/66* (2013.01)

(58) Field of Classification Search
CPC .......... H04L 7/04; H03L 7/0807; H03M 1/66
See application file for complete search history.

(56) References Cited

U.S. PATENT DOCUMENTS

| | | | |
|---|---|---|---|
| 9,397,824 B1 * | 7/2016 | Hoshyar | H04L 7/0331 |
| 10,491,365 B1 * | 11/2019 | Lin | H04L 7/0033 |
| 2005/0200391 A1 * | 9/2005 | Steinbach | H03L 7/099 327/156 |
| 2013/0191679 A1 * | 7/2013 | Zhuang | H04L 7/033 713/503 |
| 2018/0175865 A1 * | 6/2018 | Gu | H03L 7/0807 |
| 2018/0191358 A1 * | 7/2018 | Wang | H03L 7/087 |
| 2020/0092077 A1 * | 3/2020 | Abramzon | H04L 7/046 |

OTHER PUBLICATIONS

Song, "A 1.0-4.0-Gb/s All-Digital CDR With 1.0-ps Period Resolution DCO and Adaptive Proportional Gain Control", IEEE Journal of Solid-State Circuits, vol. 46, No. 2, Feb. 2011, 11 pages.
High-Speed Circuits and Systems, Lab.,Yonsei University, "High-speed Serial Interface", Yonsei University, Lect. 16—Clock and Data Recovery 3, 2013, 28 pages.

(Continued)

*Primary Examiner* — David B Lugo
(74) *Attorney, Agent, or Firm* — Christopher P. Maiorana, PC

(57) ABSTRACT

An apparatus includes a slicer circuit, a frequency acquisition circuit, a phase acquisition circuit and an oscillator circuit. The slicer circuit may be configured to (i) generate an output signal by slicing a data signal in response to a clock signal and (ii) generate a crossing signal in response to the data signal and the clock signal. The frequency acquisition circuit may be configured to generate a first control signal and a second control signal in response to the data signal and the clock signal. The phase acquisition circuit may be configured to generate a third control signal in response to the first control signal and the data crossing signal. The oscillator circuit may be configured to generate the clock signal in response to the second control signal and the third control signal. The second control signal may shift an adjustable frequency range of the clock signal.

20 Claims, 7 Drawing Sheets

(56) References Cited

OTHER PUBLICATIONS

Shu, "A 4-to-10.5 Gb/s Continuous-Rate Digital Clock and Data Recovery With Automatic Frequency Acquisition", IEEE Journal of Solid-State Circuits, vol. 51, No. 2, Feb. 2016, 12 pages.
Chen, "A 10-Gb/s Low Jitter Single-Loop Clock and Data Recovery Circuit With Rotational Phase Frequency Detector", IEEE Transactions on Circuits and Systems-I: Regular Papers, vol. 61, No. 11, Nov. 2014, 10 pages.

* cited by examiner

CLOCK DATA RECOVERY FOR AUTOMOTIVE VISION SYSTEM

FIELD OF THE INVENTION

The invention relates to computer vision generally and, more particularly, to a method and/or apparatus for implementing a clock data recovery for an automotive vision system.

BACKGROUND

A receiver clock data recovery loop in an automotive-grade serial data link has a number of design considerations. The serial data links commonly operate over wide process, voltage, and temperature ranges. Automotive-grade applications often specify that a data link remains stable through system power glitches and large temperature shifts. Additional considerations are cost and power. Bidirectional power-over-coax links are becoming standard in industrial applications. Low power designs are commonly used in portable applications. For automotive uses, spread spectrum clocking is introduced to spread energy from signal edges across a wider band, so that electromagnetic interference noise peak is reduced.

It would be desirable to implement a clock data recovery for an automotive vision system.

SUMMARY

The invention concerns an apparatus including a slicer circuit, a frequency acquisition circuit, a phase acquisition circuit and an oscillator circuit. The slicer circuit may be configured to (i) generate an output signal by slicing a data signal in response to a clock signal and (ii) generate a crossing signal in response to the data signal and the clock signal. The frequency acquisition circuit may be configured to generate a first control signal and a second control signal in response to the data signal and the clock signal. The phase acquisition circuit may be configured to generate a third control signal in response to the first control signal and the data crossing signal. The oscillator circuit may be configured to generate the clock signal in response to the second control signal and the third control signal. The second control signal may shift an adjustable frequency range of the clock signal.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a clock data recovery for an automotive vision system that may (i) be adaptable to wide process, voltage and temperature ranges, (ii) include a frequency acquisition period, (iii) include a phase acquisition period, (iv) be resistant to electromagnetic interference, (v) provide good jitter tracking ability and/or (vi) be implemented as one or more integrated circuits.

Embodiments of the invention may comprise a digitally-controlled oscillator and clock data recovery apparatus suitable for use in automotive vision systems. At the receiving end of a serial data link, the apparatus generally provides transportation of data between remote video sensors and local advanced driver-assistance systems processors. Designs of the apparatus may establish reference-less and wide process, voltage and temperature tolerance ranges during a frequency acquisition (e.g., frequency locking) period. The designs may include a combined phase acquisition (e.g., phase locking) loop period using a current steering digital-to-analog converter-based digitally-controlled oscillator. A clock data recovery loop of the apparatus may have a good power rejection ability and may be adaptive to a wide temperature range (e.g., AEC-Q 100 grade: −40 degrees Celsius to 105 degrees Celsius) without reset or relock. To reduce cost and power, a reference-less design may be provided in a near-end enclosure to reduce system design costs.

Furthermore, the apparatus may be adaptive to electromagnetic interference and have a good jitter tracking ability. In automotive-grade applications there may be large degradation on signals (e.g., in a signal eye diagram) caused by inter-symbol interference, long distance cabling, the environment, and/or multiple noise sources (e.g., including noise introduced by a digitally controlled oscillator). Good jitter tracking by the loop may enable following the received distorted signal.

Figure 1:
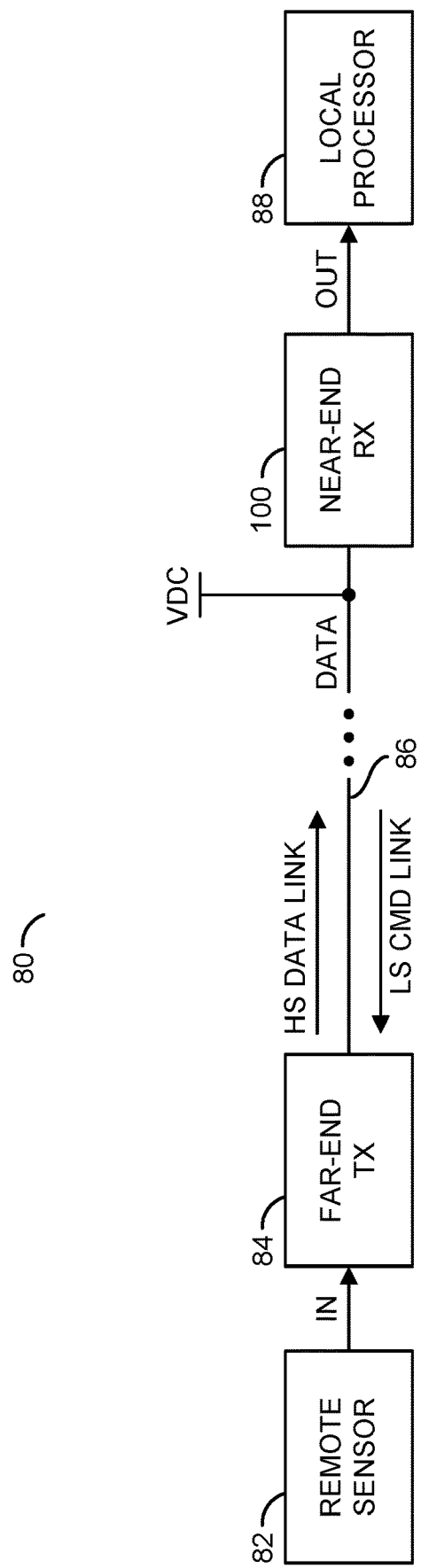
FIG. 1 is a diagram of a system illustrating a context of the invention.

Referring to FIG. 1, a diagram of a system 80 is shown illustrating a context of the invention. In various embodiments, the system (or apparatus) 80 may implement an automotive vision system. The system 80 generally comprises a block (or circuit) 82, a block (or circuit) 84, a link 86, a block (or circuit) 88 and a block (or circuit) 100. The circuits 82 to 100 may be implemented in hardware, software executing in the hardware, firmware executing in the hardware or any combination thereof in an apparatus.

An input signal (e.g., IN) may be generated by the circuit 82 and presented to the circuit 84. The signal IN may implement an input signal that carries sensor data (e.g., video data) generated by the circuit 82. A data signal (e.g., DATA) may be exchanged between the circuit 84 and the circuit 100. The signal DATA may be a bidirectional signal. The signal DATA may convey high speed data on the link 86 from the circuit 84 to the circuit 100. The signal DATA may convey low speed commands on the link 86 from the circuit 100 to the circuit 84. A voltage signal (e.g., VDC) may be received by the link 86. The signal VDC may implement a low-voltage (e.g., 12 volt) direct current voltage used to bias circuitry in the circuit 84 and/or the circuit 100.

An output signal (e.g., OUT) may be generated by the circuit 100 and transferred to the circuit 88. The signal OUT may implement an output signal used to carry the sensor data to the circuit 88.

The circuit 82 may implement a remote sensor circuit. The sensor circuit 82 may be operational to generate the sensor data in the signal IN. In various embodiments, the sensor circuit 82 may be a camera circuit and the sensor data may be video data. In some embodiments, the sensor circuit 82 may be a digital video camera, a digital still camera or a hybrid digital video/still camera.

The circuit 84 may implement a transmitter (or transceiver) circuit. The transmitter circuit 84 is generally operational to convert the sensor data received in the signal IN from a parallel format to a serial format and transmit the serial data in the high speed data link on the link 86. The transmitter circuit 84 may also be operational to receive the commands via the low speed command link on the link 86. The commands may be converted from the serial format to the parallel format. In some embodiments, the transmitter circuit 84 may be located in near proximity (e.g., less than two feet) from the sensor circuit 82.

The link 86 may implement an automotive communication connection. The link 86 is generally operational to provide bidirectional serial communications between the transmitter circuit 84 and the circuit 100. The link 86 may be configured as a high-speed data link and a low-speed command link. The high-speed data link may carry the sensor data across the link 86 from the transmitter circuit 84 to the circuit 100. The low-speed command link may carry commands from the circuit 100 to the transmitter circuit 84.

The link 86 may be a single-ended, bi-directional wire/cable. In an example, implementing the link 86 as a single-ended, bi-directional cable may reduce costs compared to using multiple wires. Both the high speed data and the low speed commands of the signal DATA may be transmitted using the single wire link 86 along with a power supply (e.g., VDC). For example, the apparatus 100 may be implemented to adapt to signal degradation over the link 86 in automotive applications.

The circuit 88 may implement one or more processor circuits. The processor circuit(s) of the local processor 88 may be generally operational to utilize the sensor data captured by the remote sensor 82 to perform one or more tasks to aid in the operation of the system 80. The tasks may include, but are not limited to, advanced driver assistance system (ADAS) tasks, lane departure warning tasks, parking tasks and rear-view vision tasks. The processor circuit 88 may also be operational to generate commands used to control the sensor circuit 82. The commands may include, but are not limited to, shutter control, aperture controls and gain controls.

The circuit 100 may implement a receiver (or transceiver) circuit. The receiver circuit (or apparatus) 100 is generally operational to recover clocking information and data received via the high-speed data link in the signal DATA. The recovered data may be sent to the processor circuit 88 via the signal OUT. The receiver circuit 100 may also be operational to send commands initiated by the processor circuit to the transmitter circuit 84 via the low-speed command link via the signal DATA. The commands may be relayed by the transmitter circuit 84 to the sensor circuit 82.

In various embodiments, the receiver circuit 100 may generate the signal OUT by slicing the data received in the signal DATA in response to a clock signal, and generate a data crossing signal in response to the signal DATA and the clock signal. The receiver circuit 100 may also generate a frequency acquisition control signal and a band-shift control signal in response to the signal DATA and the clock signal. The receiver circuit 100 may also generate a phase acquisition control signal in response to the frequency acquisition control signal and the data crossing signal. The clock signal may be generated in response to the band-shift control signal and the phase acquisition control signal. The frequency acquisition control signal may adjust the clock signal based on a frequency acquisition loop response to the signal DATA. The band-shift control signal generally shifts an adjustable frequency range of the clock signal. The band-shift control signal may also adjust a frequency of the clock signal to a middle of the adjustable frequency range. The phase acquisition control signal may adjust the clock signal in response to a phase acquisition loop response to the data crossing signal.

Figure 2:
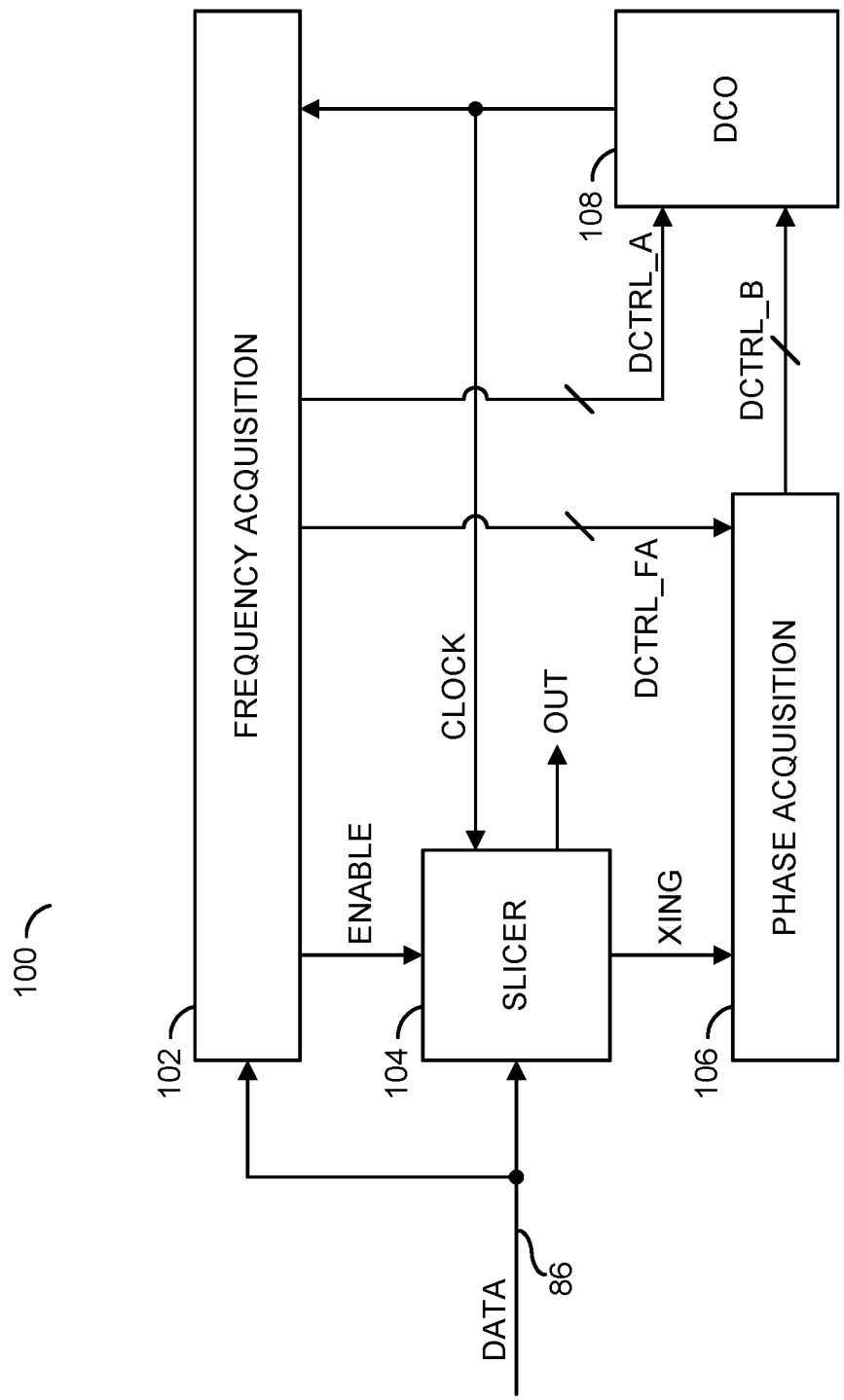
FIG. 2 is a diagram illustrating an implementation of a receive portion of a receiver circuit of the system in accordance with an example embodiment of the invention.

Referring to FIG. 2, a diagram illustrating an implementation of a receive portion of the receiver circuit 100 is shown in accordance with an example embodiment of the invention. The receiver circuit 100 generally comprises a block (or circuit) 102, a block (or circuit) 104, a block (or circuit) 106 and a block (or circuit) 108. The circuits 102 to 108 may be implemented in hardware, software executing in the hardware, firmware executing in the hardware or any combination thereof in an apparatus. In various embodiments, the circuits 102 to 108 may be implemented in one or more integrated circuits.

The signal DATA may be received by the circuit 102 and the circuit 104. The signal OUT may be generated by the circuit 102. An enable signal (e.g., ENABLE) may be generated by the circuit 102 and received by the circuit 104. The signal ENABLE may alternatively convey an enable state and a disable state to the circuit 104. A signal (e.g., XING) may be generated by the circuit 104 and transferred to the circuit 106. The signal XING may carry data crossing information that indicates when the signal DATA crosses a threshold. The circuit 102 may generate a signal (e.g., DCTRL_FA) received by the circuit 106. The digital control signal DCTRL_FA may convey control information based on a frequency acquisition loop response to the signal DATA. In an example, a bus may be implemented to transmit the control information of the signal DCTRL_FA. The circuit 102 may also generate a signal (e.g., DCTRL_A) presented to the circuit 108. The digital control signal DCTRL_A may carry multiple control signals used to shift a frequency band of the clock signal and adjust a frequency of the clock signal toward a center of the frequency band. A signal (e.g., DCTRL_B) may be generated by the circuit 106 and presented to the circuit 108. The digital control signal DCTRL_B may convey multiple control signals that each adjust the frequency of the clock signal. The circuit 108 may generate a clock signal (e.g., CLOCK) that is received by the circuit 102 and the circuit 104. The signal CLOCK may implement the recovered clock signal. In various embodiments, the signal CLOCK may be a multi-phase (e.g., four-phase) clock signal.

The circuit 102 may implement a frequency acquisition circuit. The frequency acquisition circuit 102 is generally operational to adjust the signal CLOCK during a frequency acquisition process (or period). The frequency acquisition period may adjust a frequency of the signal CLOCK to be close enough to a target data rate (or half the data rate, depending on a type of phase detector implemented in the circuit 106) so that the frequency/phase offset may be adapted during a phase acquisition process (or period) to lock to the signal DATA. During the frequency acquisition period, the frequency acquisition circuit 102 may generate the signal DCTRL_A to adjust a frequency range band of the signal CLOCK into a "middle" range of possible frequencies, and subsequently adjust the signal CLOCK toward a middle of the frequency range. The signal DCTRL_FA may be adjusted to get the clock frequency close to a clocking frequency embedded in the signal DATA. During the frequency acquisition period, the frequency acquisition circuit 102 may also deassert the signal ENABLE (e.g., present the signal ENABLE in the disabled state (or mode)) to disable the circuit 104. After the frequency acquisition period has ended, the signal ENABLE may be presented in the enabled state (or mode) to enable the circuit 104.

The circuit 104 may implement a slicer circuit. The slicer circuit 104 is generally operational to recover the data received in the signal DATA and present the recovered data to the processor circuit 88 (FIG. 1) in the signal OUT. The slicer circuit 104 may also be operational to generate a pulse in the signal XING each time the voltage in the signal DATA crosses a voltage threshold.

The circuit 106 may implement a phase acquisition circuit. The phase acquisition circuit is generally operational to adjust the signal CLOCK via the signal DCTRL_B during the frequency acquisition period and during a phase acquisition process (or period). During the frequency acquisition period, the phase acquisition circuit 106 may copy (or pass) the control information received in the signal DCTRL_FA to the circuit 108 in the signal DCTRL_B, which may adjust the signal CLOCK to match a frequency of the signal DATA. During the phase acquisition period, the phase acquisition circuit 106 may adjust a phase of the signal CLOCK to match a phase of the data in the signal DATA. After the phase acquisition period, the phase acquisition circuit 106 may adjust the signal CLOCK to maintain a lock with the signal DATA.

The circuit 108 may implement a digitally controlled oscillator circuit. The oscillator circuit 108 is generally operational to generate the signal CLOCK in response to the signal DCTRL_A and the signal DCTRL_B. In various embodiments, the signal CLOCK may be a multi-phase (e.g., four-phase) clock signal. A design of the oscillator circuit 108 may be employed to save power, save area and allow a digital loop filter design to enlarge a programmable frequency range and relax analog constrains.

Figure 3:
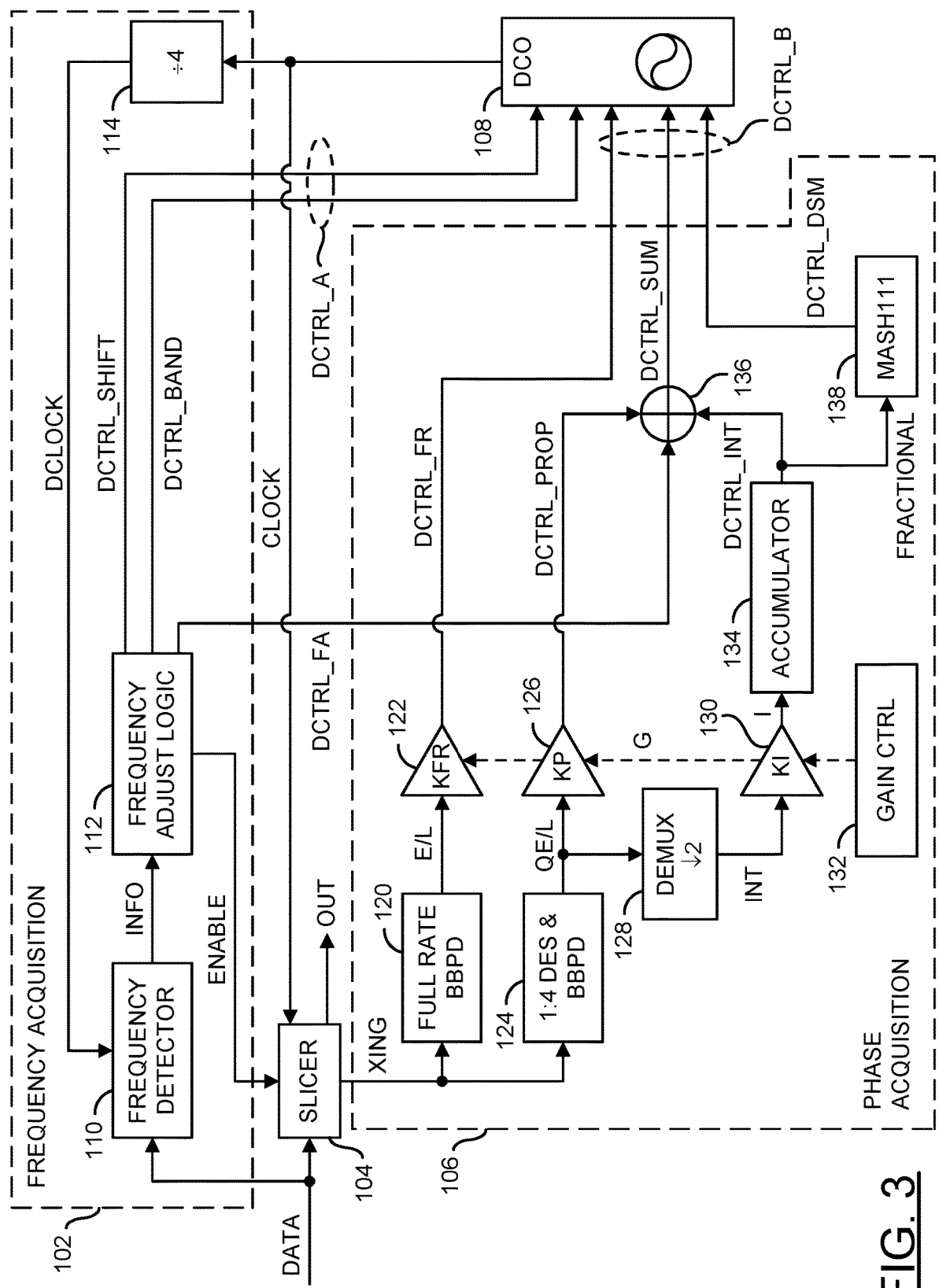
FIG. 3 is a diagram illustrating an implementation of a frequency acquisition circuit and a phase acquisition circuit of the receiver circuit in accordance with an example embodiment of the invention.

Referring to FIG. 3, a diagram illustrating an implementation of the frequency acquisition circuit 102 and the phase acquisition circuit 106 is shown in accordance with an example embodiment of the invention. The frequency acquisition circuit 102 generally comprises a block (or circuit) 110, a block (or circuit) 112 and a block (or circuit) 114. The phase acquisition circuit 106 generally comprises a block (or circuit) 120, a block (or circuit) 122, a block (or circuit) 124, a block (or circuit) 126, a block (or circuit) 128, a block (or circuit) 130, a block (or circuit) 132, a block (or circuit) 134, a block (or circuit) 136 and a block (or circuit) 138. The circuits 110 to 138 may be implemented in hardware, software executing in the hardware, firmware executing in the hardware or any combination thereof in an apparatus.

The signal DATA may be received by the circuit 110. The signal ENABLE may be generated by the circuit 112. A signal (e.g., INFO) may be generated by the circuit 110 and transferred to the circuit 112. The signal INFO may convey frequency change information. The circuit 110 may receive a signal (e.g., DCLOCK) from the circuit 114. The signal DCLOCK may be a divided version of the signal CLOCK. A signal (e.g., DCTRL_SHIFT) may be generated by the circuit 112 and presented to the oscillator circuit 108. The digital control signal DCTRL_SHIFT may convey information used to shift a frequency of the signal CLOCK. A signal (e.g., DCTRL_BAND) may also be generated by the circuit 112 and presented to the oscillator circuit 108. The digital control signal DCTRL_BAND may carry information used to shift a frequency band of the signal CLOCK. A combination of the signal DCTRL_SHIFT and the signal DCTRL_BAND may form the digital control signal DCTRL_A.

The signal XING may be received by the circuit 120 and the circuit 124. The signal DCTRL_FA may be generated by the circuit 112 and presented to the circuit 136. The control signal DCTRL_FA may carry frequency adjust information used to adjust a frequency of the signal CLOCK. A signal (e.g., E/L) may be generated by the circuit 120 and presented to the circuit 122. The signal E/L may carry early/late phase information between the phase of the signal DATA and the signal CLOCK. A signal (e.g., QE/L) may be generated by the circuit 124 and received by the circuit 126 and the circuit 128. The signal QE/L may convey early/late phase information at a fraction (e.g., a quarter) of the rate of the signal E/L. A signal (e.g., INT) may be generated by the circuit 128 and presented to the circuit 130. The signal INT may be a demultiplexed version of the signal QE/L and conveys integration information. A signal (e.g., I) may be generated by the circuit 130 and presented to the circuit 134. The signal I may carry an amplified version of the signal INT. A signal (e.g., G) may be generated by the circuit 132 and presented to the circuits 122, 126 and 130. The signal G may present a variable gain value to the circuits 122, 126 and 130.

The circuit 122 may generate a full rate signal (e.g., DCTRL_FR) presented to the oscillator circuit 108. The digital control signal DCTRL_FR may convey full rate phase control information. The circuit 126 may generate a signal (e.g., DCTRL_PROP) received by the circuit 136. The digital control signal DCTRL_PROP may carry proportional phase information. An accumulation signal (e.g., DCTRL_INT) may be generated by the circuit 134 and received by the circuit 136. The digital control signal DCTRL_INT may carry an accumulated (or integrated) version of the signal INT. A portion of the signal DCTRL_INT (e.g., FRACTIONAL) may be received by the circuit 138. The fraction rate signal FRACTIONAL may convey the fractional value generated by the circuit 134. The circuit 136 may generate a signal (e.g., DCTRL_SUM) presented to the oscillator circuit 108. The digital control signal DCTRL_SUM may carry a sum of the control information received in the signals DCTRL_FA, the signal DCTRL_PROP and the signal DCTRL_INT. A modulation signal (e.g., DCTRL_DSM) may be generated by the circuit 138 and received by the oscillator circuit 108. The digital control signal DCTRL_DSM may carry special control information having a small tuning range. A combination of the signal DCTRL_FR, the signal DCTRL_SUM and the signal DCTRL_DSM may form the digital control signal DCTRL_B.

The circuit 110 may implement a frequency detector. The frequency detector circuit 110 is generally operational to generate the frequency difference information in the signal INFO. The frequency difference information may be calculated in response to a frequency difference detected between the signal DATA and the signal DCLOCK.

The circuit 112 may implement a frequency adjust logic circuit. The frequency adjust logic circuit 112 is generally operational to generate the signal ENABLE, the signal DCTRL_SHIFT and the signal DCTRL_BAND in response to the signal INFO. The frequency detector circuit 110 and the frequency adjust logic circuit 112 may work together to provide a phase and/or frequency lock.

The frequency detector circuit 110 may be configured to define a time window based on counting a number of clock edges (e.g., $E_C$) of the signal DCLOCK. In an example, the frequency detector circuit 110 may implement counters. The frequency detector circuit 110 may count a number of data edges (e.g., $E_D$) of the signal DATA in the time window. The frequency adjust logic circuit 112 may be configured to generate the signal DCTRL_BAND (e.g., most significant bits) and the signal DCTRL_FA (e.g., least significant bits) based on a binary search and comparison. In an example, the frequency adjust logic 112 may perform the binary search and comparison by implementing a finite state machine. The frequency adjust logic 112 may be configured to analyze the number of clock edges $E_C$ and the number of data edges $E_D$ to determine whether the frequency of the clock signal CLOCK is too high or too low. For example, the signals DCTRL_BAND and DCTRL_FA may be adjusted to increase the frequency if the frequency of the signal CLOCK is too low.

The frequency adjust logic circuit 112 may be configured to determine whether the initial frequency acquisition period is done (or finished) and/or calculate an offset to a center of the frequency range. For example, the frequency adjust logic circuit 112 may implement comparison and subtraction operations using combinational logic and/or a finite state machine. If the frequency range of the signal DCTRL_SUM is outside of a range of available control signals, the frequency adjust logic circuit 112 may generate the signal DCTRL_SHIFT and the operations of the frequency detector circuit 110 and the frequency adjust logic circuit 112 may be repeated. The signal ENABLE may be generated after a next frequency acquisition operation is performed or if the frequency range of the signal DCTRL_SUM is not outside of a range of the available control signals. Phase acquisition operations may be initiated in response to the signal ENABLE.

The circuit 114 may implement a multi-phase clock divider circuit. The clock divider circuit 114 may be operational to divide each phase of the signal CLOCK by an integer (e.g., four) value. The divided clock phases may be presented in the signal DCLOCK. Other division factors may be implemented to meet the design criteria of a particular application.

The circuit 120 may be implement a full rate bang-bang phase detector (BBPD) circuit. The phase detector circuit 120 is generally operational to generate the signal E/L in response to the data crossings in the signal XING.

The circuit 122 may implement a variable gain amplifier circuit. The amplifier 122 is generally operational to generate the signal DCTRL_FR by amplifying the signal E/L. The amplification may be based on the gain value in the signal G.

The circuit 124 may implement a 1:N (e.g., 1:4) deselection and bang-bang phase detector circuit. The phase detection circuit 124 is generally operational to generate the signal QE/L in response to the data crossings in the signal XING at the fractional rate.

The circuit 126 may implement a variable gain amplifier circuit. The amplifier 126 is generally operational to generate the signal DCTRL_PROP by amplifying the signal QE/L. The amplification may be based on the gain value in the signal G.

The circuit 128 may implement a demultiplexing circuit. The demultiplexing circuit 128 is generally operational to generate the signal INT by demultiplexing the signal QE/L. In various embodiments, the demultiplexing may be a factor of two.

The circuit 130 may implement a variable gain amplifier circuit. The amplifier 130 is generally operational to generate the signal I by amplifying the signal INT. The amplification may be based on the gain value in the signal G.

The circuit 132 may implement a gain control circuit. The gain control circuit 132 is generally operational to generate the signal G. The gain value in the signal G may be varied by the gain control circuit 132 to achieve an appropriate gain in the signal DCTRL_FR, DCTRL_PROP and DCTRL_INT.

The circuit 134 may implement an accumulator circuit. The accumulator circuit 134 is generally operational to accumulate the integral information from the signal I. The accumulated value may have an integer portion and a fractional portion. The accumulated value may be presented in the signal DCTRL_INT. The fractional portion may be presented in the signal FRACTION.

The circuit 136 may implement a summation circuit. The summation circuit 136 is generally operational to sum the digital control values received in the signals DCTRL_FR, DCTRL_PROP and DCTRL_INT to produce a main digital control value in the signal DCTRL_SUM.

The circuit 138 may implement a multistage noise shaping (MASH) structured delta-sigma modulator (DSM) circuit. The modulator circuit 138 is generally operational to generate a digital control value in the signal DCTRL_DSM based on the signal FRACTIONAL. The modulator circuit 138 may increase a resolution of the integral path and reduce a design cost of a digital-to-analog converter in the oscillator circuit 108.

Generally, the circuits 110-112 in the frequency acquisition circuit 102 and the circuits 122-138 in the phase acquisition circuit 106 may be implemented in a digital domain and/or may be synthesizable. The BBPD circuit 120 may be a custom-designed circuit. For example, the BBPD circuit 120 may be custom-designed for high speed application.

In one example, the variable gain amplifiers 122, 126 and/or 130 may be implemented as digital variable gain amplifiers.

For example, the digital variable gain amplifiers 122, 126 and/or 130 may be implemented by a left shift or a right shift of input codes. The number of bits to shift may be determined in response to the signal G. The input codes may be extended by the signal E/L and/or QE/L. The variable gain amplifiers 122, 126 and/or 130 may each perform an amplification having a certain ratio, which may be programmable. In an example, the amplification Ki of the variable gain amplifier 130 may be aG, the amplification Kp of the variable gain amplifier 126 may be bG and the amplification Kfr of the variable gain amplifier 122 may be cG and the values a, b and c may be fixed to particular numbers.

Figure 4:
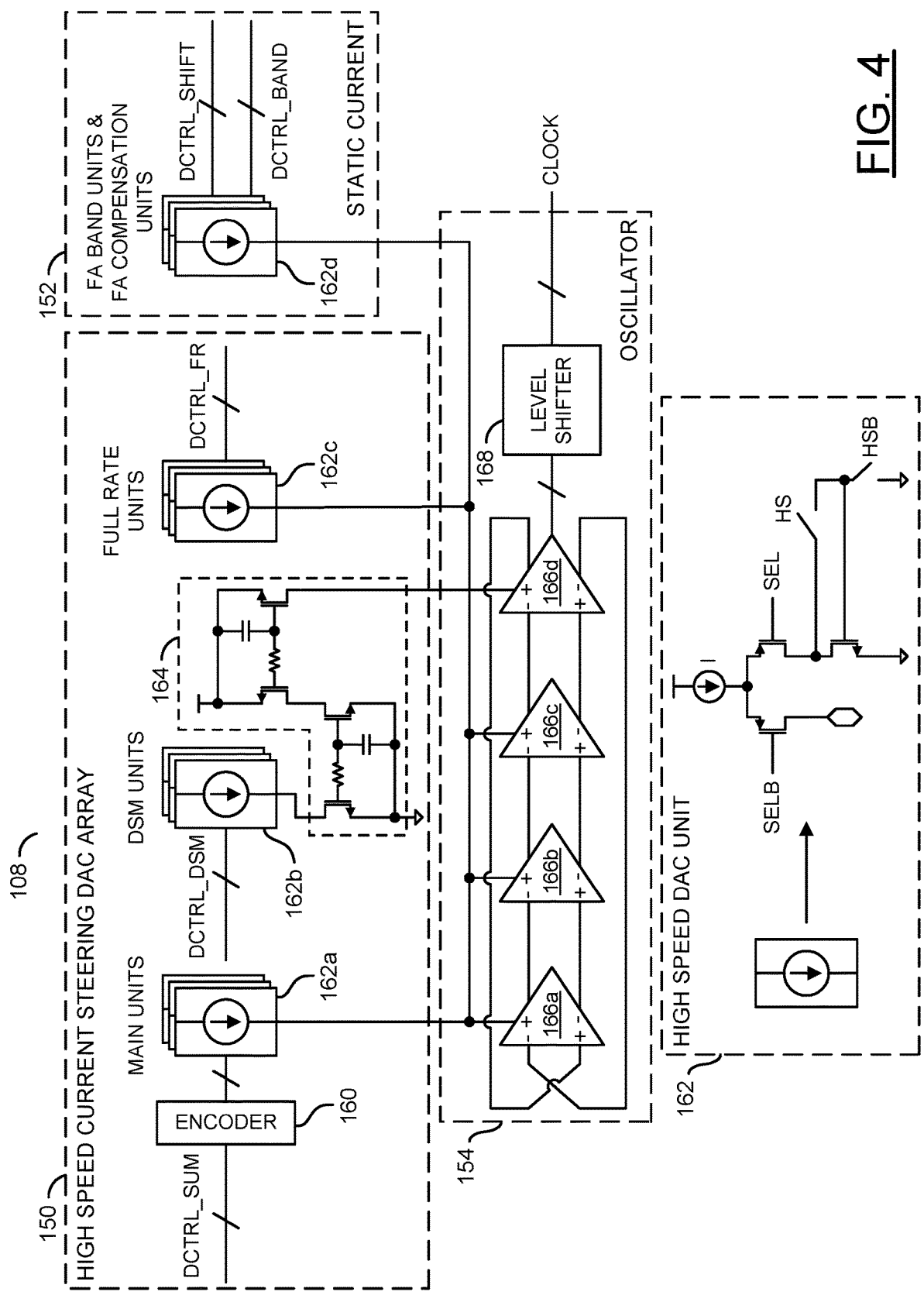
FIG. 4 is a diagram illustrating an implementation of an oscillator circuit of the receiver circuit in accordance with an example embodiment of the invention.

Referring to FIG. 4, a diagram illustrating an implementation of the oscillator circuit 108 is shown in accordance with an example embodiment of the invention. In various embodiments, the oscillator circuit 108 may implement a current steering DAC oscillator circuit. The oscillator circuit 108 generally comprises a block (or circuit) 150, a block (or circuit) 152 and a block (or circuit) 154. The circuit 150 generally comprises a block (or circuit) 160, multiple blocks (or circuits) 162*a*-162*c* and a block (or circuit) 164. The circuit 152 generally comprises a block (or circuit) 162*d*. The circuit 154 generally comprise multiple blocks (or circuits) 166*a*-166*d* and a block (or circuit) 168. The circuits 150 to 168 may be implemented in hardware.

The signal DCTRL_SUM may be received by the circuit 160. The signal DCTRL_DSM may be received by the circuit 162b. The signal DCTRL_FR may be received by the circuit 162c. The signal DCTRL_SHIFT and the signal DCTRL_BAND may be received by the circuit 162d. The signal CLOCK may be generated by the circuit 168.

The circuit 150 may implement a high-speed current steering digital-to-analog (DAC) array circuit. The DAC circuit 150 is generally operational to generate a dynamic bias current used by the circuit 154. The dynamic bias current may be determined by the digital control values in the signals DCTRL_SUM, DCTRL_DSM and DCTRL_FR.

The circuit 152 may implement a static current DAC circuit. The DAC circuit 152 is generally operational to generate a static bias current used by the circuit 154. The static bias current may be determined by the digital control values in the signals DCTRL_SHIFT and DCTRL_BAND. The circuit 152 may comprise frequency acquisition band units and/or frequency acquisition compensation units.

The circuit 154 may implement a ring oscillator circuit. The ring oscillator circuit 154 is generally operational to generate the multi-phase signal CLOCK. The frequency of the signal CLOCK may be controlled by the dynamic bias current provided by the DAC circuit 150 and the DAC circuit 152.

The circuit 160 may implement an encoder circuit. The circuit 160 is generally operational to implement a thermal code encoder. In an example, the signal DCTRL_SUM may be a binary value. The encoder 160 may encode most significant bits (MSBs) of the signal DCTRL_SUM in thermal codes in order to reduce a frequency glitch during updating.

The circuits 162a-162d may each implement multiple controlled current source circuits. The current source circuits 162a may generate a current based on the digital control value received via the signal DCTRL_SUM. The current source circuits 162a may implement main units. The MSBs of the signal DCTRL_SUM may be encoded in thermal codes in the main units 162a. The current source circuits 162b may generate a current based on the digital control value received via the signal DCTRL_DSM. The current source circuits 162b may implement DSM units. The current source circuits 162c may generate a current based on the digital control value received via the signal DCTRL_FR. The current source circuits 162c may implement full rate units. The current source circuits 162d may generate a current based on the digital control value received via the signals DCTRL_SHIFT and DCTRL_BAND. The current source circuits 162d may implement frequency acquisition band units and/or frequency acquisition compensation units.

Each path of each current source circuit 162a-162d may be implemented as shown in block 162. Inside each high speed current source circuit 162a-162c, any unused current may be dumped to ground and a closed switch HS may bias the shared drain nodes to a proper value, in order to prevent a response slow down caused by repeating settling of a parasitic capacitance in each circuit 162a-162c. To save power, only "in range" high speed circuits 162a-162c may dump the current. The current source circuit 162d may be considered as a static current source by closing a switch HSB and opening a switch HS. While a signal (e.g., SEL) is false and a complementary signal (e.g., SELB) is true, current generated by a current source I may be routed to the oscillator circuit 154. While the select signal SEL is true and the signal SELB is false, the current generated by the current source may be steered to signal ground.

The circuit 164 may implement a current mirror. The current mirror 164 is generally operational to generate a current that mirrors the current produced by the controlled current source 162b.

Each circuit 166a-166d may implement an amplifier circuit. The amplifier circuits 166a-166d may be arranged in a multi-element (e.g., four-element) ring configuration. The summation of the current flow from all of the current sources 162a-162d may drive the amplifier circuits 166a-166d. A signal in the amplifier circuit 166a-166d may oscillate at a frequency that depends on a speed of each amplifier circuit 166a-166d. The speeds of the amplifier circuits 166a-166d are generally controlled by the bias current supplied from the DAC circuit 150 and the DAC circuit 152.

The circuit 168 may implement a level shifter circuit. The level shifter circuit 168 is generally operational to shift a voltage level of the multi-phase clocks signals generated by the amplifier circuits 166a-166d to rail-to-rail voltage levels for the signal CLOCK.

The current mode oscillator circuit 108 may have a much wider tuning range with acceptable response speed than common switch-capacitor based oscillators and voltage DAC based oscillators. Another advantage of the current-based design may be that a current mode summation is an easy implantation to accumulate separate portions of a result without considering a digital overflow issue. Moreover, each current source circuit 162a-162d may be split into several parallel segments. Each parallel segment may be controlled separately while a performance relationship is kept linear.

In the design of the receiver circuit 100 shown, the control signals may be DCTRL_BAND, DCTRL_SHIFT, DCTRL_SUM, DCTRL_FR, and DCTRL_DSM. The signals DCTRL_BAND and DCTRL_SHIFT generally provide the most weighted bias current. The control values in the signals DCTRL_BAND and DCTRL_SHIFT may only be switched during the low speed frequency acquisition period (or process). Thus, the current source from the current source circuits 162d may be considered as a static current source. The control signals DCTRL_SUM and DCTRL_FR generally contribute a main oscillator frequency tuning range. The signal DCTRL_SUM may be controlled by the digital summation of the proportional path (e.g., DCTRL_PROP) and the integral path (e.g., DCTRL_INT). The control signal DCTRL_FR may be controlled by the full rate bang-bang phase detection path. The control signal DCTRL_DSM may be a special case of the control signal DCTRL_SUM with a smaller tuning range. The control signal DCTRL_DSM may be filtered by the current mirror 164 for delta-sigma modulation. Note that during the frequency acquisition period, the control signals DCTRL_PROP and DCTRL_INT may be invalid.

Figure 5:
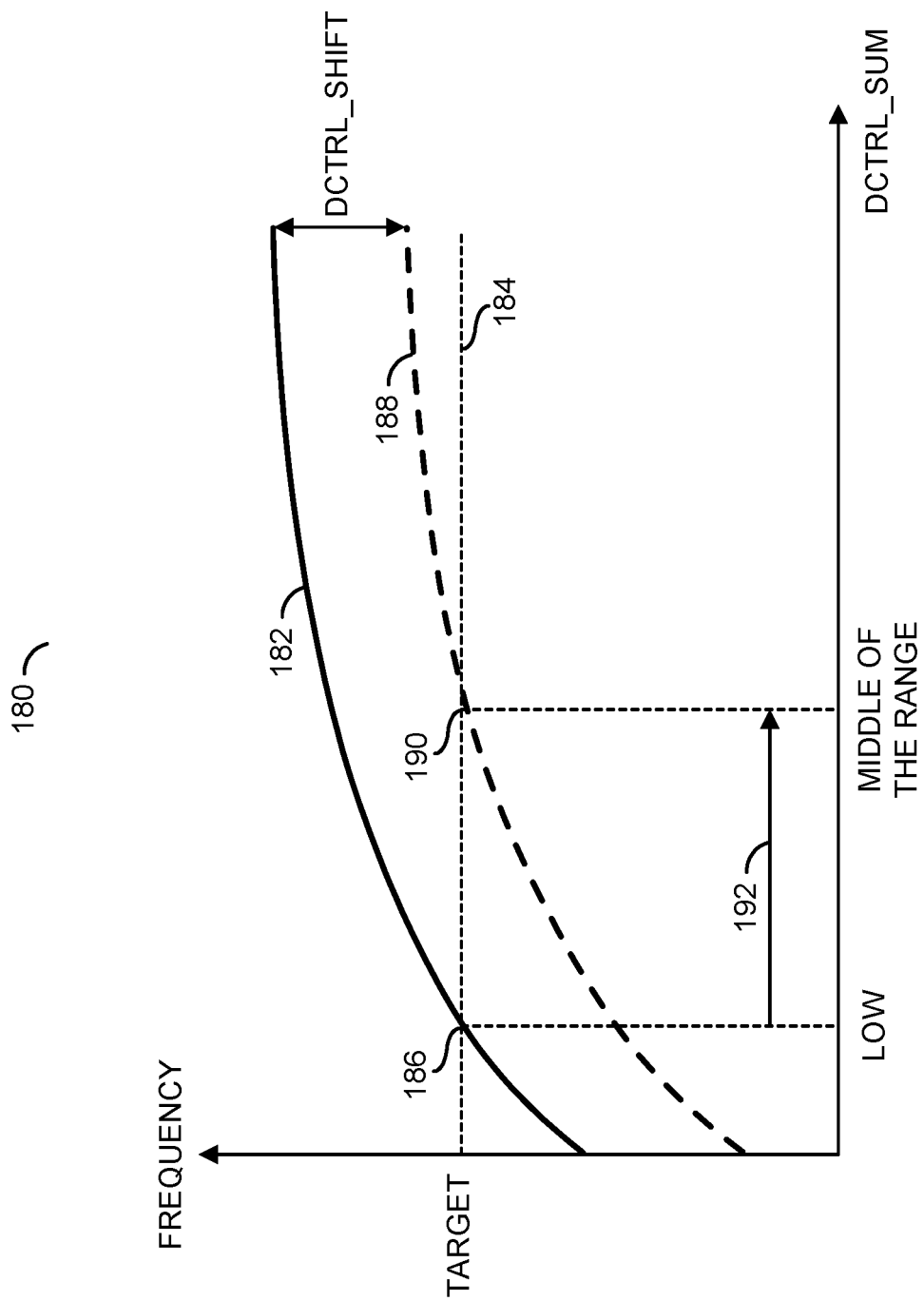
FIG. 5 is a diagram illustrating a frequency response of the oscillator circuit as a function of control signals in accordance with an example embodiment of the invention.

Referring to FIG. 5, a diagram 180 illustrating a frequency response of the oscillator circuit 108 as a function of the signal DCTRL_SUM and the signal DCTRL_SHIFT is shown in accordance with an example embodiment of the invention. The frequency of the signal CLOCK may be shown along a Y-axis. The digital control value in the signal DCTRL_SUM may be illustrated along the X-axis.

A curve 182 may illustrate an example response of the oscillator circuit 108 at startup. To achieve a target frequency 184, the control value in the signal DCTRL_SUM may be set to a value 186. The value 186 may be a low value in a range of possible control values. The control value in the signal DCTRL_SHIFT may be changed by the frequency acquisition circuit 102 to move the response from the curve 182 to the curve 188. To achieve the target frequency 184, the control value in the signal DCTRL_SUM may be at a value 190. The value 190 may be closer to a middle of the range of possible control values that the value 182. A shift in the control value may be shown by arrow 192. A digital filter loop may define a "range" based on bandwidth configurations.

Figure 6:
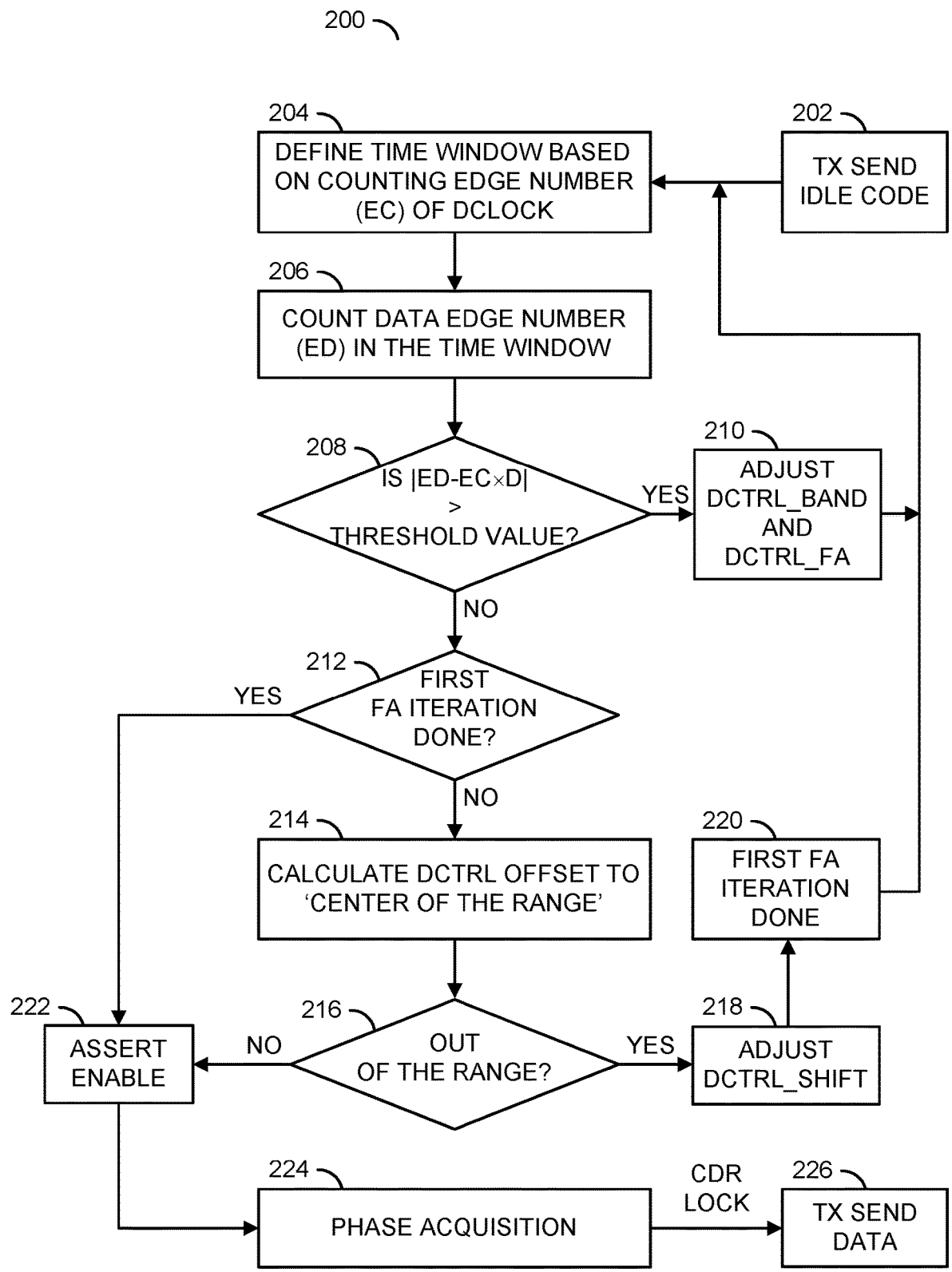
FIG. 6 is a flow diagram of an implementation of a frequency/phase lock method in accordance with an example implementation of the invention.

Referring to FIG. 6, a flow diagram of an implementation of a frequency/phase lock method 200 is shown in accordance with an example implementation of the invention. The method (or process) 200 may be implemented by the receiver circuit 100. The method 200 generally comprises a step (or state) 202, a step (or state) 204, a step (or state) 206, a decision step (or state) 208, a step (or state) 210, a decision step (or state) 212, a step (or state) 214, a decision step (or state) 216, a step (or state) 218, a decision step (or state) 220, a step (or state) 222, a step (or state) 224) and a step (or state) 226. The sequence of the steps 202 to 226 is shown as a representative example. Other step orders may be implemented to meet the criteria of a particular application.

The frequency acquisition loop established by the frequency acquisition circuit 102 may be used to control the oscillator circuit 108 to adjust the signal CLOCK to a frequency that is close enough to the target data rate 184 (or half the data rate, depending on the phase detector type), so that the frequency/phase offset may be adaptive during the phase acquisition period.

The frequency acquisition loop may be counter based. By counting a number of rising edges in the signal DATA during a time window defined by the oscillator circuit 108, a relationship between the frequency of the oscillator circuit 108 and the reference frequency in the signal DATA may be determined.

If a data transition probability is known in advance, the relationship between the data rate and the reference clock may also be calculated. Under an assumption, the reference clock may be eliminated from the signal DATA. Instead, by counting data edge numbers in the time window defined by the signal CLOCK, the clock frequency may be detected and adjusted.

In the step 202, the receiver circuit 100 may receive an idle code via the bus 86. The idle code generally comprises a regular (or uniform) sequence of transitions that may be used to establish a frequency and phase lock between the signal CLOCK and the signal DATA. Next, in the step 204, a time window may be defined in the receiver circuit 100 based on counting a number of clock edges $E_C$ of the signal DCLOCK. In the step 206, the frequency acquisition circuit 102 may count a number of data edges $E_D$ in the time window. In an example, the step 204 and the step 206 may be performed by the frequency detector 110. Next, the method 200 may move to the decision step 208.

In the time window, the rising clock edge number $E_C$ and the data rising edge number $E_d$ may have a relationship according to formula 1 as follows:

$$E_D = E_C \times D \qquad (1)$$

Where the constant D may be a data transition density (rising edges), and the transition density may be statistically predictable. For example, using an idle code of a scalable low voltage signaling embedded clock (SLVS-EC) standard (e.g., constant zero encoded by 8b10b encoder), the statistical predictability may be 0.3. The 0.3 predictability may be implemented by the summation of an edge count register left shifting per formula 2 as follows:

$$ED = EC \times (\frac{1}{2}^2 + \frac{1}{2}^5 + \frac{1}{2}^6 + \frac{1}{2}^9 + \frac{1}{2}^{10} + \frac{1}{2}^{13} + \ldots) \qquad (2)$$

Configurable logic capable of programming different transition densities is generally employed to adapt to multiple transmission protocols.

In the decision step 208, the frequency adjustment logic circuit 112 may determine whether an absolute value of $E_D - E_C \times D$ is greater than or less than a threshold value. In an example, the frequency acquisition may be considered to be converged when the absolute value of $E_D - E_C \times D$ is less than the threshold value (e.g., $|E_D - E_C \times D| <$ threshold). The threshold value may be an integer value. The threshold value may be an adjustable and/or programmable value. In an example, when the threshold value is smaller than the frequency acquisition iteration may take longer to converge and the obtained frequency of the signal DCLOCK may have less mismatch with the target value 184.

In the decision step 208, if the absolute value of $E_D - E_C \times D$ is greater than the threshold value, then the method 200 may move to the step 210. In the step 210, the signals DCTRL_BAND and DCTRL_FA may be adjusted. Next, the method 200 may return to the step 204. The steps 204, 206, 208 and 210 may be repeated until convergence (e.g., as determined by the decision step 208).

Generally, after the counting window is cover, the result of $E_D - E_C \times D$ may be compared to the programmable threshold value. For example, first the absolute value of $E_D - E_C \times D$ may be compared to the threshold value. If the absolute value of $E_D - E_C \times D$ is larger than the threshold value, then the frequency of the signal CLOCK may not be close enough to the target value 184. Whether the result of $E_D - E_C \times D$ is a positive value or a negative value may provide guidance on how to adjust the frequency of the signal CLOCK. In one example, if $E_D - E_C \times D$ is greater than zero, then in the step 210, the signal DCTRL_BAND and/or the signal DCTRL_FA may be adjusted to cause the frequency of the signal CLOCK to go higher. In another example, if $E_D - E_C \times D$ is less than zero, then in the step 210, the signal DCTRL_BAND and/or the signal DCTRL_FA may be adjusted to cause the frequency of the signal CLOCK to go lower. The decision step 208 and the step 210 may be implemented by the frequency adjust logic circuit 112. The frequency comparison iteration generally uses a binary search to adjust the signal DCTRL_BAND and the signal DCTRL_FA according to the sign (e.g., positive or negative) of the result of $E_D - E_C \times D$. The steps 204, 206, 208 and 210 may be repeated until the absolute value of $E_D - E_C \times D$ is smaller than the threshold value.

In some embodiments, after the counting window is over, a ratio of the two counts may be compared with the constant D in the decision step 208. For example, if the ratio $E_D/E_C$ is greater than D, then the frequency of the signal CLOCK may be too low and if the ratio $E_D/E_C$ is less than D, then the frequency of the signal CLOCK may be too high. However, determining the absolute value of $E_D - E_C \times D$ may, as opposed to the ratio $E_D/E_C$, may provide adjustability on how close the frequency of the signal DCLOCK is approaching the target value 184. Furthermore, implementing a division operation may involve more complexity than a multiplication operation. Generally, the convergence condition may be that the absolute value of $E_D - E_C \times D$ is less than the programmable threshold value.

In the decision step 208, if the absolute value of $E_D - E_C \times D$ is not greater than the threshold value, then the method 200 may move to the decision step 212. In the decision step 212, the frequency adjust logic circuit 112 may determine whether a first iteration of frequency acquisition period is done (e.g., whether the initial frequency acquisition has finished). In an example, a flag signal may be implemented by the frequency adjust logic circuit 112 for differentiating between the first frequency acquisition iteration and the second frequency acquisition iteration. If the first frequency acquisition iteration has been completed (e.g., the frequency acquisition is performing a second frequency acquisition iteration), then the method 200 may move to the step 222 (e.g., to begin the phase acquisition). If the first frequency iteration has not been completed, the method 200 may move to the step 214 (e.g., to perform a frequency shift and potentially a second frequency acquisition iteration).

Figure 7:
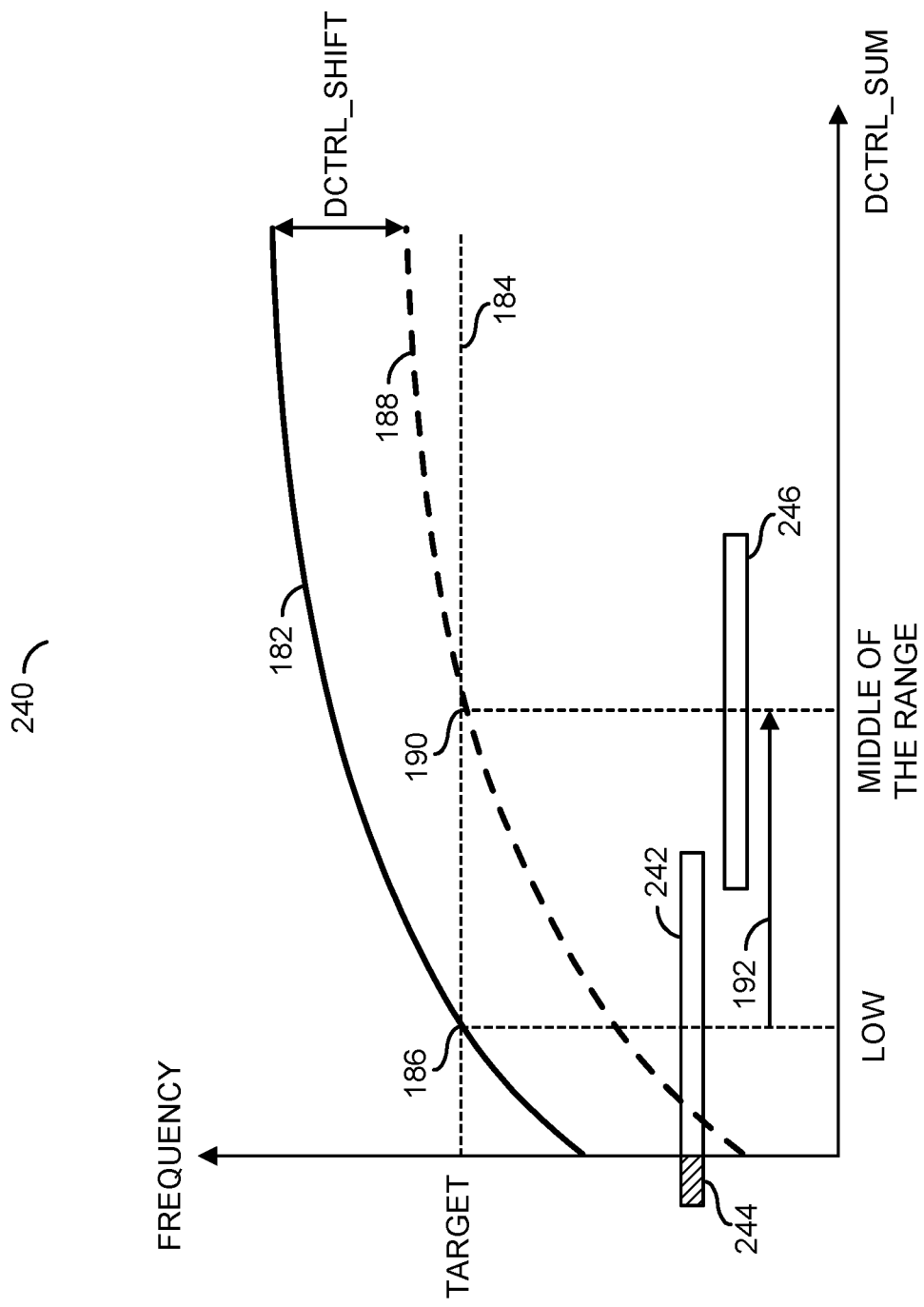
FIG. 7 is a diagram illustrating an example low control range in an example embodiment of the invention.

Referring to FIG. 7, a diagram 240 illustrating an example low control range is shown in an example embodiment of the invention. The diagram 240 may be a graph comprising the frequency of the signal CLOCK along the Y-axis, the digital control value in the signal DCTRL_SUM along the X-axis, the curve 182 of the example response of the oscillator circuit 108 at startup curve, the target frequency 184, the low value in a range of possible control values 186, the shifted response curve 188, the middle value of the range of possible control values 190 and the shift in the control value 192 as shown in the diagram 180 shown in association with FIG. 5.

The diagram 240 may further comprise a range 242, a section 244, and a range 246. The range 242 may be an initial range of the signal DCTRL_SUM. The section 244 may be a section of the initial range 242 that is below a minimum value. The range 246 may be shifted range.

For some circumstances, the signal DCTRL_SUM may be adjusted in the initial frequency acquisition period to a relative low or high value within the entire range. In the example shown, the initial range 242 of the signal DCTRL_SUM may extend below a minimum value in the section 244. Unfortunately, the ring oscillator 154 of the oscillator circuit 108 may be temperature sensitive, even when the bias current is kept constant. Consequentially, the control value in the signal DCTRL_SHIFT (when maintaining a fixed frequency) may be as large as approximately 30 percent to approximately 40 percent of the whole control value range over a temperature range from approximately −40 degrees Celsius to approximately 105 degrees Celsius. If the temperature shifting and/or phase tracking make the control value in the signal DCTRL_SUM underflow or overflow, the phase lock generally fails.

Returning to FIG. 6, in the step 214, in the first iteration of the frequency acquisition (e.g., the control value 186 is obtained), compensation logic in the frequency adjust logic circuit 112 may calculate and compensate the distance (e.g., the offset) 192 between the value 186 and the middle value 190 in a middle of the range by adjusting the signal DCTRL_SHIFT. Adjusting the control value in the signal DCTRL_SHIFT may move the response from the curve 182 to the curve 188, and move the range 242 to the range 246. As a result, the control value in the signal DCTRL_SUM may settle at the value 190 near a middle of the range 246 leaving enough shifting margin in the control value for the circumstances mentioned above. In an example, calculating the offset for DCTRL_SHIFT may prevent a phase lock fail situation. Next, the method 200 may move to the decision step 216.

In the decision step 216, the frequency adjust logic circuit 112 may be configured to perform a check to determine if the range 246 still extends out of the available range of control values for the signal DCTRL_SUM. If no out-of-range condition exists, the method 200 may move to the step 222. If an out-of-range condition exists, the method 200 may move to the step 218. In the step 218, the frequency adjust logic circuit 112 may adjust the control value in the signal DCTRL_SHIFT. Next, in the step 220, the first frequency acquisition iteration may be done. In an example, the flag signal implemented by the frequency adjust logic circuit 112 may be set to indicate that the second frequency acquisition iteration has started. In some embodiments, the first frequency acquisition iteration may be considered to be done after the decision step 212 (e.g., the start of the second frequency acquisition iteration may begin with the step 214). Next, the method 200 return to the step 204. Returning to the step 204 may begin the second frequency acquisition iteration. For example, in the second frequency acquisition the steps 204-210 may be repeated until convergence (e.g., determined in the decision step 208), then the method 200 may return to the decision step 212.

In the second frequency acquisition iteration and in the decision step 212, the method 200 may not go the steps 214-220. For example, the steps 214-220 may only be performed before the second frequency acquisition iteration performs the steps 204-210. In the second iteration, frequency adjust logic circuit 112 may detect the second frequency acquisition iteration and the method 200 may move to the step 222.

In the step 222, the frequency adjust logic circuit 112 may generate the signal ENABLE. The signal ENABLE may be presented to the slicer 104. Next, the method 200 may move to the step 224. In the step 224, the phase acquisition circuit 106 may attempt to lock the phase of the signal CLOCK to the phase of the signal DATA with the value 190 as a starting point. The phase lock may be achieved by normal sub-steps within the step 222. Once a phase lock has been achieved, the receiver circuit 100 may transfer a "send data" command to the transmitter circuit 84 via the low-speed command link of the bus 86 in the step 224.

Generally, the first frequency acquisition iteration may perform the steps 204-210 until convergence (e.g., $E_D - E_C \times D$ is less than the programmable threshold). After convergence in the first frequency acquisition iteration, the steps 214-216 may be performed. If the range 242 is not out of the available range of control values, the signal ENABLE may be asserted and phase acquisition will be initiated. If the range 242 is out of the available range of control values, then the step 218 may be performed and the second frequency acquisition iteration may be started. The steps 214-220 may only be performed during and/or after the first frequency acquisition iteration and may not be repeated (e.g., only performed once). The second frequency acquisition may perform the steps 204-210 until convergence (e.g., $E_D - E_C \times D$ is less than the programmable threshold). After convergence in the second frequency acquisition iteration (e.g., as indicated by the flag signal), the second frequency acquisition iteration may be completed and the phase acquisition may be implemented (e.g., the steps 214-220 may not be performed after convergence in the second frequency acquisition iteration). Generally, the core portion of the first frequency acquisition iteration and the second frequency acquisition iteration is performing the steps 204-210 until the convergence condition is met.

In some embodiments, the frequency acquisition circuit 102 and the phase acquisition circuit 106 shown in association with FIG. 3 may be implemented as a passive phase acquisition loop. The passive phase acquisition loop generally comprises the slicer circuit 104, a variation of the phase acquisition circuit 106 with the signal DCTRL_FA coming from an internal source and a variation of the oscillator circuit 108 without the signal DCTRL_A.

An original phase acquisition loop model may be obtained from an analog phase-lock loop passive loop filter implementation. By way of example, a series RC connection may be mapped as a combination of the proportional path and the integral path in the discrete time domain. The gain of the proportional path and the integral path may be $K_P$ and $K_I$ respectively. The loop bandwidth is generally dominated by $K_P$.

By increasing the value $K_P$, the loop may track the signal (with noise) better. However, the introduced jitter may harm the loop. The tradeoff may be problematic when the noise jitter is large, especially when spread spectrum clocking is enabled. In one example, the digital loop may normally not operate at a speed as high as the data rate, which may result in an introduction of a delay that may affect the loop response.

In embodiments of the invention, the proportional path and the integral path may be operated at a reduced clock rate (e.g., 4× reduced rate to 8× reduced rate). In addition, the full rate bang-bang phase detector circuit 120 may be employed to build a separate full rate path that controls a group of oscillator circuit digital codes without delay cells. The separate full rate path may act as a highly efficient proportional path for high slew rate jitter tracking, and the gain of the amplifier 122 may be relatively smaller. For longer term jitter tracking and large frequency offset when switching from the frequency locking to the phase locking process, the integral path with a relatively larger gain in the amplifier 126 may be utilized. The MASH structure delta-sigma modulator circuit 138 may increase the resolution of the integral path and reduce the design cost of a digital-to-analog converter in the oscillator circuit 108. A low pass filter for the delta-sigma modulation may be implemented in the oscillator circuit 108 using a current mirror in the analog domain.

Gain control logic in the circuit 132 may constrain the relationship between the gains of the three paths (full, proportional and integral) to keep the loop stable. For low frequency and low jitter applications, the full rate path may be disabled to save power.

The functions performed by the diagrams of FIGS. 1-7 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROMs (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, cloud servers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a slicer circuit configured to (i) generate an output signal by slicing a data signal in response to a clock signal and (ii) generate a crossing signal in response to said data signal and said clock signal;
   a frequency acquisition circuit configured to generate a first control signal and a second control signal in response to said data signal and said clock signal;
   a phase acquisition circuit configured to generate a third control signal in response to said first control signal and said crossing signal; and an oscillator circuit configured to generate said clock signal in response to said second control signal and said third control signal, wherein said second control signal shifts an adjustable frequency range of said clock signal.

2. The apparatus according to claim 1, wherein said apparatus forms part of an automotive vision system.

3. The apparatus according to claim 1, wherein said second control signal further adjusts a frequency of said clock signal to a middle of said adjustable frequency range.

4. The apparatus according to claim 1, wherein during a frequency acquisition period (i) said frequency acquisition circuit is further configured to deassert an enable signal to disable said slicer circuit, (ii) said phase acquisition circuit generates said third control signal as a copy said first control signal and (iii) said third control signal adjusts said clock signal to match a frequency of said data signal.

5. The apparatus according to claim 1, wherein for a phase acquisition period (i) said frequency acquisition circuit is further configured to assert an enable signal to enable said slicer circuit and (ii) said phase acquisition circuit is further configured to adjust said third control signal to change said clock signal to match a phase of said data signal.

6. The apparatus according to claim 1, wherein said phase acquisition circuit is configured to (i) generate a full rate signal by a full rate phase detection of said crossing signal and (ii) generate said third control signal in further response to said full rate signal.

7. The apparatus according to claim 1, wherein said phase acquisition circuit is configured to (i) generate a fractional rate signal by a fractional rate phase detection of said crossing signal and (ii) generate said third control signal in further response to said fractional rate signal.

8. The apparatus according to claim 7, wherein said phase acquisition circuit is configured to (i) generate an accumulation signal in response to an accumulation of said fractional rate signal and (ii) generate said third control signal in further response to said accumulation signal.

9. The apparatus according to claim 8, wherein said phase acquisition circuit is configured to (i) generate a modulation signal in response to said accumulation signal and (ii) generate said third control signal in further response to said modulation signal.

10. The apparatus according to claim 1, wherein (i) said frequency acquisition circuit is further configured to generate said first control signal in response to comparing an edge count of said clock signal and an edge count of said data signal to a programmable threshold value and (ii) perform said shift of said adjustable frequency range if said adjustable frequency range is below a minimum value.

11. The apparatus according to claim 10, wherein after said shift of said adjustable frequency range, said frequency acquisition circuit is configured to perform a second iteration of generating said first control signal in response to comparing said edge count of said clock signal and said edge count of said data signal to said programmable threshold value.

12. A method for clock data recovery comprising the steps of:
generating an output signal by slicing a data signal in response to a clock signal using a slicer circuit;
generating a data crossing signal in response to said data signal and said clock signal;
generating a first control signal and a second control signal in response to said data signal and said clock signal;
generating a third control signal in response to said first control signal and said data crossing signal; and
generating said clock signal in response to said second control signal and said third control signal, wherein said second control signal shifts an adjustable frequency range of said clock signal.

13. The method according to claim 12, wherein the steps form part of an automotive vision system.

14. The method according to claim 12, wherein said second control signal further adjusts a frequency of said clock signal to a middle of said adjustable frequency range.

15. The method according to claim 12, wherein during a frequency acquisition period said method further comprises the step of:
deasserting an enable signal to disable said slicer circuit, wherein (i) said third control signal is generated as a copy said first control signal and (ii) said third control signal adjusts said clock signal to match a frequency of said data signal.

16. The method according to claim 12, wherein for a phase acquisition period said method further comprises the step of:
asserting an enable signal to enable said slicer circuit; and
adjusting said third control signal to change said clock signal to match a phase of said data signal.

17. The method according to claim 12, further comprising the step of:
generating a full rate signal by a full rate phase detection of said data crossing signal, wherein said third control signal is generated in further response to said full rate signal.

18. The method according to claim 12, further comprising the step of:
generating a fractional rate signal by a fractional rate phase detection of said data crossing signal, wherein said third control signal is generated in further response to said fractional rate signal.

19. The method according to claim 18, further comprising the step of:
generating an accumulation signal in response to an accumulation of said fractional rate signal, wherein said third control signal is generated in further response to said accumulation signal.

20. The method according to claim 19, further comprising the step of:
generating a modulation signal in response to said accumulation signal, wherein said third control signal is generated in further response to said modulation signal.

* * * * *